United States Patent
Fukuda

[11] Patent Number: 6,054,387
[45] Date of Patent: Apr. 25, 2000

[54] METHOD FOR FORMING A SILICIDE REGION

[75] Inventor: Yukio Fukuda, Ibaraki, Japan

[73] Assignee: Texas Instruments Incorporated, Dallas, Tex.

[21] Appl. No.: 08/927,696

[22] Filed: Sep. 11, 1997

Related U.S. Application Data

[60] Provisional application No. 60/026,024, Sep. 13, 1996.

[51] Int. Cl.[7] .......................... H01L 21/28; H01L 21/336; H01L 21/3205
[52] U.S. Cl. .......................... 438/683; 438/682; 438/655
[58] Field of Search .................................. 438/683, 682, 438/655, 664

[56] References Cited

U.S. PATENT DOCUMENTS

| | | | |
|---|---|---|---|
| 4,690,730 | 9/1987 | Tang et al. | 156/643 |
| 4,940,509 | 7/1990 | Tso et al. | 156/653 |
| 5,023,201 | 6/1991 | Stanasolovich et al. | 437/192 |
| 5,326,724 | 7/1994 | Wei | 437/200 |
| 5,593,924 | 1/1997 | Apte et al. | 437/200 |

OTHER PUBLICATIONS

Ofuchi et al. "Theoretical Study on Stress–Induced C54 to C49 Phase Transition of TiSi2," Proceedings of the Symposium on Semiconductors and Integrated Circuits Technology (1995), vol. 49. p. 132–137.

*Primary Examiner*—Charles Bowers
*Assistant Examiner*—Evan Pert
*Attorney, Agent, or Firm*—Robby T. Holland; Wade James Brady, III; Frederick J. Telecky, Jr.

[57] ABSTRACT

A method of forming a suicide layer 12 is disclosed herein. In one embodiment, a refractory metal (e.g., titanium) layer 20 is formed over a silicon (e.g., polysilicon) layer 10. The silicon layer 10 and the titanium layer 20 are then heated to a first temperature so that the silicon 10 and titanium 20 react to form a titanium silicide region 12. While applying an external force to warp the device, the titanium silicide region 12 is heated to a second temperature. This second temperature is higher than the first temperature. In one embodiment, this two-step heating process helps facilitate the transition from C49 phase $TiSi_2$ to C54 phase $TiSi_2$.

23 Claims, 4 Drawing Sheets

1

METHOD FOR FORMING A SILICIDE REGION

This application claims priority under 35 USC § 119(e)(1) of provisional application Ser. No. 60/026,024, filed Sep. 13, 1996.

CROSS-REFERENCE TO RELATED APPLICATIONS

Provisional Application Ser. No. 60/024,235, filed Aug. 20, 1996 and application Ser. No. 08/910,095, filed Aug. 12, 1997 (now abandoned) and commonly assigned are related to the present invention and are hereby incorporated herein by reference.

FIELD OF THE INVENTION

This invention relates generally to the fabrication of semiconductor devices and specifically to an improved silicide process.

BACKGROUND OF THE INVENTION

As integrated circuits are made smaller, low resistivity materials are needed as interconnects. Metal silicides such as tungsten (W), titanium (Ti), molybdenum (Mo) and cobalt (Co) polycide are very attractive candidates. Titanium polycide is especially attractive since it indicates lowest resistivity.

Self-aligned silicide (or salicide) processes are presently used for lowering the resistivity of transfer gates and n- or p-type diffused layers. See e.g., Science Forum Corp., "Ti SALICIDE Process," *VLSI Process Data Book*, p322. But as gate widths become narrower, very shallow junctions will be necessary to avoid short channel effects. Unfortunately, it is difficult to apply conventional titanium salicide processes to devices with shallow junctions since the depth from the titanium suicide ($TiSi_2$) interface to the p-n (or n-p) junction is marginal.

It is known that among refractory metal suicides, $TiSi_2$ is considered to be an optimal choice for applications such as contacts and interconnects on silicon MOS devices. The thin-film reaction of titanium on silicon often results in the formation of $TiSi_2$. The two different crystal structures of $TiSi_2$ most often observed in thin film reactions are the C49 and C54 types. The C49 structure is base-centered orthorhombic and the C54 structure is face-centered orthorhombic. The C54 phase is the only $TiSi_2$ phase which occurs in the binary-phase diagram, and therefore the C49 phase is considered to be metastable. In general, see Jeon et al., "Morphology and phase stability of $TiSi_2$ on Si," J. Appl. Phy. 71(9), May 1, 1992, pp4269–76.

During fabrication, the metastable C49 structure is formed at a relatively low temperature, for example at about 500° C., while the stable C54 structure is formed at higher temperatures of about 700° C. During formation of a titanium silicide layer, the initial nucleation will be to the metastable C49 phase rather than the C54 phase due to a lower free-energy barrier to nucleation. Unfortunately, the transition from the C49 phase to the C54 phase is difficult because C54 has high packing density compared with C49. This density difference causes a reduction in volume during the anneal process. However, a thin $TiSi_2$ on a rigid surface, such as a silicon substrate, cannot shrink freely since the adhesive bond before any phase transition restricts reduction of volume and causes a tensile stress. If the volume of the C54 phase $TiSi_2$ is expanded by 1.08 times (if a tensile stress of more than 380 MPa is applied), then the total energy of C49 $TiSi_2$ will be less than that of C54 $TiSi_2$. See "Theoretical study of stress induced C54-to-C49 transition of $TiSi_2$," Extended Abstracts of the 56th Annual Meeting, 1995, The Japan Society of Applied Physics.

It is known to fabricate a titanium silicide layer using two annealing steps. For example, U.S. Pat. No. 5,043,300 (which issued Aug. 27, 1991 and is incorporated by reference herein) teaches depositing a titanium layer on a cleaned semiconductor wafer. The wafer is then moved from a vacuum deposition chamber to an annealing chamber being careful not to expose it to oxygen-bearing gases. Within the annealing chamber, the wafer is annealed in a nitrogen-bearing atmosphere for about 20 to 60 seconds at a temperature from about 500° C. to about 695° C. This process step forms a titanium silicide layer and a layer of titanium nitride over the suicide. In addition, the titanium which had been deposited over silicon oxide surfaces is reacted to form titanium nitride. The wafer temperature is then raised to between about 800° C. and 900° C. to convert the titanium suicide to a stable phase. The wafer can then be etched to remove titanium nitride.

Two papers were presented at the August 1995 meeting of the Japan Society of Applied Physics in Kanazawa, Japan. In "Theoretical Study on Stress-Induced C54 to C49 Phase Transition of $TiSi_2$," Ohfuti et al. studied theoretically how stress affects a phase transition of $TiSi_2$. In this paper, the authors include a figure which shows the volume dependence of the total energy of C49 and C54 structure d $TiSi_2$. The volume is normalized by th at of non-stressed C54. The total energy of C54 becomes higher than that of C49 when the volume is expanded over 1.08. This value corresponds to the tensile stress of 380 Mpa, obtained by differentiating the energy versus volume relation. In this paper, the authors conclude that the phase transition from C49 to C54 may not take place under the tensile stress over 380 Mpa.

At t his conference, Kawamura et al. also presented a paper entitled "Stress Effects on the C49-C54 Phase Transition of $TiSi_2$." In the formation of $TiSi_2$, the so-called two-step annealing process is generally used. In the first step, Ti/Si bilayer (patterned or non-patterned) is annealed at a low temperature to form C49 phase $TiSi_2$. Then in the second step, C49 phase $TiSi_2$ is annealed at higher temperature to transition to C54 phase. The authors of this paper tried applying compressive stress to enhance the C49 to C54 phase transition by depositing a titanium layer on the backside of the Si wafer. They deposited Ti layers on both front a nd back sides and then annealed the wafer at 600° C. for fifteen minutes in an argon atmosphere to form C49 $TiSi_2$ on both sides. After that, they annealed the wafer at 650° C. for 30 seconds in argon to form C54 $TiSi_2$.

The paper included a figure which showed how the sheet resistivity of the $TiSi_2$ layer of the frontside decreased as a function of the annealing time (a number of annealing cycles at 650° C. for 30 seconds each). The Ti thickness of the backside was varied as another parameter. The results show that the sheet resistivity of $TiSi_2$ decreases rapidly as the backside Ti thickness increases. The authors measured the stress applied to the $TiSi_2$ layer of the frontside and found that a compressive stress was applied when there was the backside $TiSi_2$.

SUMMARY OF THE INVENTION

The present invention teaches a method of forming a suicide region which overcomes problems exhibited by the prior art. More specifically, the present invention provides a simple method for forming a titanium silicide region which is substantially of the C54 phase. In the preferred embodiment, the method uses two heating steps such that a compressive stress is applied during the second heating step. This unique method facilitates the formation of a high conductivity silicide layer.

In one embodiment, a titanium (or tungsten) layer is formed over a silicon (e.g., polysilicon) layer. The silicon layer and the titanium layer are then heated to a first temperature so that the silicon layer and titanium react to form a titanium silicide region. While applying an external force to warp the device, the titanium silicide region is heated to a second temperature. This second temperature is higher than the first temperature.

Accordingly, one aspect the present invention teaches the use of a stress inducing wafer chuck to facilitate the transformation of C49 titanium suicide to C54 titanium silicide. The C54 transition from the C49 phase is then wellcontrolled by minimizing the free energy barrier.

As a result, the present invention provides a practical and low cost method for forming low resistance interconnects.

BRIEF DESCRIPTION OF THE DRAWINGS

The above features of the present invention will be more clearly understood from consideration of the following descriptions in connection with accompanying drawings in which:

FIG. 3b illustrates a cross-sectional view of a small portion of the wafer of FIG. 3a;

Corresponding numerals and symbols in the different figures refer to corresponding parts unless otherwise indicated.

DETAILED DESCRIPTION OF ILLUSTRATIVE EMBODIMENTS

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

The present invention teaches a method of forming a metal silicide which overcomes many of the shortcomings of prior art methods. In one aspect, the present invention contemplates the application of an external stress during formation of the silicide. This stress will facilitate the formation of a silicide region. In a preferred embodiment, a titanium silicide region is formed. In order to overcome the prior art difficulties, the substrate is warped while the silicide region is being formed.

Figure 1:
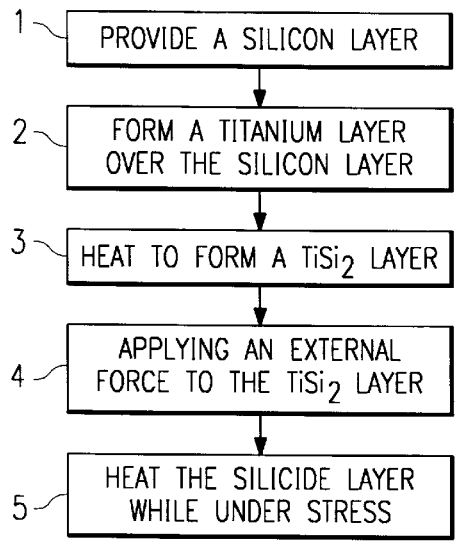
FIG. 1 is a flow chart of a simplified process.

FIG. 1 illustrates a simplified process flow for achieving this goal. In Step 1, a silicon layer is provided. A titanium layer is then formed over the silicon layer in Step 2. In Step 3 of the illustrative process flow, the silicon and titanium layers are heated to form a titanium silicide layer. Typically this heating or annealing step is performed at a relatively low temperature and therefore the metastable C49 phase of titanium silicide is formed. In Step 4, an external force is applied to the device so that the substrate is physically warped. The suicide layer is then heated at a higher temperature to form C54 phase titanium suicide.

Figure 2A:
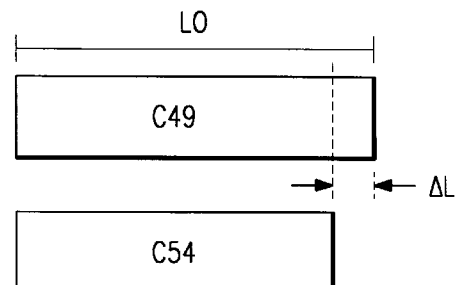
FIG. 2a illustrates the stress and compression created during the reaction of a silicide region.
Figure 2B:
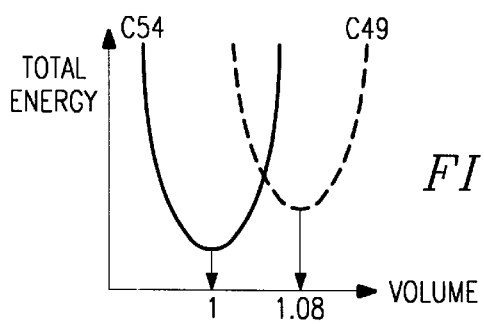
FIG. 2b graphically illustrates the relationship between total energy and volume of C49 and C54 TiSi$_2$ regions.

The phase transition from C49 to C54 is difficult because of tensile stress since the C54 phase has a higher packing density than the C49 phase. This difference in packing density causes a difference in volume as illustrated in FIG. 2a. In this illustrative example, the C49 phase material is L0 units wide while the C54 phase material is ΔL delta units shorter. (The actual material has differences in all three dimensions despite the FIG. 2a's one-dimensional illustration.) If the C54 titanium suicide is forced to expand by 1.08 times, the total energy of the C49 phase will be less than that of C54. (FIG. 2b graphically illustrates the energy/volume relationship for C49 and C54 TiSi$_2$.) Therefore, the C49 will become stable under application of tensile stress. In order to facilitate C54 transition from C49, the tensile stress which accompanies the phase transition must be eliminated. Namely, the tensile stress can be avoided by applying a compressive stress to the C49 layer prior to the phase transition (i.e., prior to the second annealing).

The amount of compressive stress σ required for the C49 TiSi$_2$ can be computed in Equation (1) below.

$$\sigma = E\varepsilon = E\frac{\Delta L}{Lo} = E\frac{1-1.08}{1} = E \times (-0.08) = 4750 \times (-0.08)$$
$$= -380 \text{ MPa}$$

In this equation, E is the Young Modulus of C49 TiSi$_2$ and ΔL and L0 are the dimensions defined in FIG. 2a.

Figure 3A:
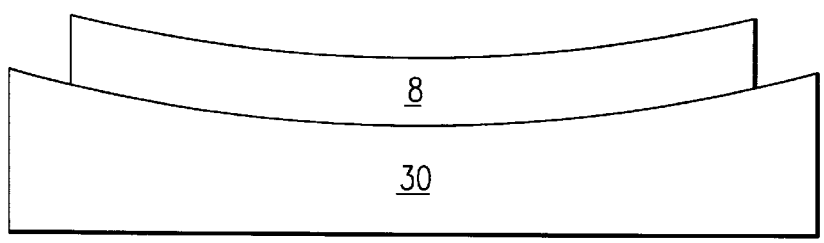
FIG. 3a illustrates a wafer being warped according to the present invention.
Figure 3B:
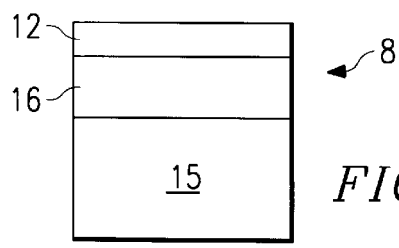

In the present invention, the wafer is annealed under a compressive stress which is sufficient to compensate the transition induced tensile stress. In the preferred embodiment of the present invention, the compressive stress is applied by warping the device 8 as illustrated in FIG. 3a. A narrow cross-section of device 8 is shown in FIG. 3b which includes substrate 15, interlevel layer 16 and titanium silicide layer 12.

The necessary warpage, that is, the radius of curvature of susceptor 30, can be calculated from the Stoney formula.

$$\sigma = Eb^2/[6 (1-v) Rd] \qquad (2)$$

where σ is the total stress in the film, E the Young Modulus of the Si substrate, v is the Poisson ratio of the Si substrate, b is the Si substrate thickness, d is the film thickness and R is the radius of curvature.

The radius of curvature R is typically between about 50 m and 500 m. For example, in typical embodiments, the radius of curvature R is typically less than 350 m and may typically be about 100 m (e.g., 75 m<R<125 m) or 214 m (e.g., 200 m<R<250 m) or 307 m (e.g., 275 m<R<325 m). Table 1 provides one example of a typical titanium silicide layer formed on a silicon substrate.

TABLE 1

| Parameter | | Value | |
|---|---|---|---|
| σ | Total stress in the film | −380 | MPa |
| E | Elastic modulus of Si | 113 | GPa |
| υ | Poisson Ratio of Si | 0.42 | |
| b | Si substrate thickness | 0.06 | cm |
| d | Film thickness | 100 | nm |
| R | Radius of Curvature | 307 | m |

Susceptor 30 may comprise a surface with a radius of curvature described above and during the warping process, the wafer may be chucked (i.e., attached to the susceptor), by vacuum or electro-static chucking. Examples of susceptors which can be used in semiconductor manufacture are disclosed in U.S. Pat. Nos. 5,547,539, 5,518,549, 5,510,297, 5,468,299, 5,091,208, 4,897,171, 4,322,592, and 4,099,041, each of which is incorporated herein by reference.

Two co-pending Applications, Ser. No. 60/024,235 filed provisionally on Aug. 20, 1996 and Ser. No. 60/026,930 filed provisionally on Sep. 18, 1996, teach a compressive stress that can be achieved by depositing a cap layer over the silicide layer. The stress within an oxide or a nitride cap layer can be controlled by varying process conditions such as pressure, temperature, and RF power (if a plasma enhanced process is used). This cap layer can be used to adjust the tensile the stress within the titanium silicide layer. The present invention is intended to include the embodiment where a cap layer is used and therefore these applications are incorporated herein by reference.

Three exemplary process flows will now be described which utilize this approach. The first flow will be described with reference to FIGS. 4a–4g and while the second will be described with reference to FIGS. 5a–5f. FIGS. 6a–6e describe a self-aligned silicide process using the present invention.

Figure 4A:
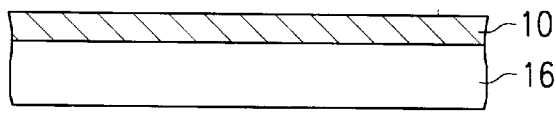
FIGS. 4a–4g illustrate cross-sectional views of various steps during a preferred embodiment process flow.

Referring first to FIG. 4a, a region 16 is provided. In one embodiment, the region 16 may comprise a silicon dioxide region such as a gate oxide, a field oxide, or an interlevel oxide. In other embodiments different regions are envisioned. For example, the region 16 may be a nitride layer or a semiconductor region. The specific starting material is not critical to the present invention so long as layer 10 will adhere throughout processing.

A silicon layer 10 is formed over the region 16. In the preferred embodiment, a polycrystalline silicon region is deposited, for example by chemical vapor deposition. This polysilicon layer 10 is preferably doped, although this is not necessary. Further, the silicon region 10 could alternatively comprise amorphous silicon or monocrystalline silicon. It is also possible that the underlying region 16 and silicon layer 10 be a single region (e.g., a substrate be silicided).

Figure 4B:
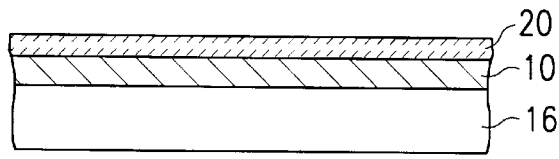

As illustrated in FIG. 4b, a titanium layer 20 is formed over the silicon layer 10. This titanium film 20 may be sputtered or formed by other methods.

Figure 4C:
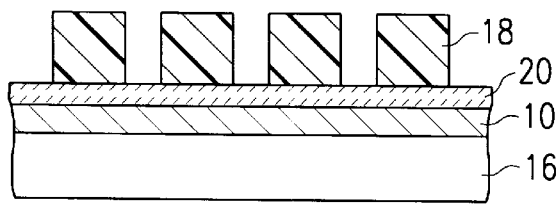
Figure 4D:
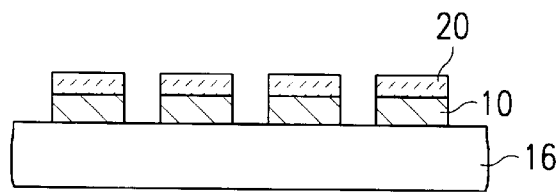

As illustrated in FIGS. 4c and 4d, an interconnect pattern is formed over the silicon and titanium regions 10 and 20. In this embodiment, photoresist layer 18 is patterned and then the polysilicon and titanium layers 10 and 20 are etched using a conventional dry etcher. Other etching techniques could also be utilized.

After the resist material 18 is removed, titanium silicide 12 is formed on the polysilicon layer 10 by heating the regions to a first temperature. This temperature may range from about 500° C. to 800° C. and is preferably between about 550° C. and 600° C. This anneal step can be performed in a nitrogen or nitrogen and hydrogen ambient. The reaction chamber may be kept at a pressure between about 50 and 500 Pa.

Figure 4E:
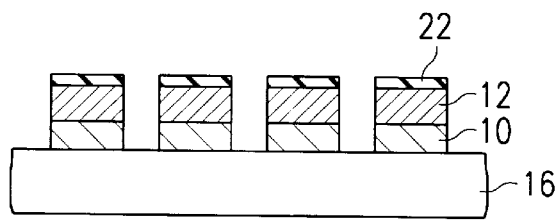

The post anneal structure is illustrated in FIG. 4e. As shown in the figure, the titanium layer 20 and polysilicon layer 10 have reacted to form titanium silicide regions 12. While some of the polysilicon material 10 remains in the example, it is possible that the entire layer 10 will be consumed by the reaction.

Figure 4F:
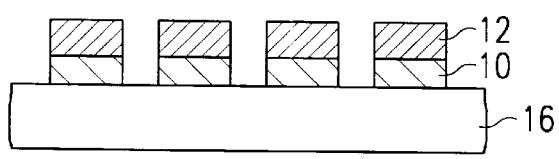

In addition, titanium nitride regions 22 may have been formed above the titanium silicide region 12. As shown in FIG. 4f, the unreacted titanium and titanium nitride regions 22 are stripped. This removal can be done using a $NH_4OH + H_2O_2$ dip. The structure illustrated in FIG. 4f now has C49 titanium silicide phase 12 formed over polysilicon 10.

At this point in the process flow, the second annealing step may occur. As illustrated in FIG. 3a, the device is heated while being warped from the chuck. To do this, a flat susceptor is simply replaced with a susceptor which has been warped as described above. This anneal is preferably performed at a temperature between about 700° C. and 750° C. but more generally in the range between about 700° C. and 900° C. This second annealing step will form the C54 phase titanium silicide. In one specific embodiment, the second anneal is performed at a temperature between 700° C. and 750° C., a pressure between 50 and 500 Pa in an $H_2 + N_2$ or an $N_2$ ambient.

Figure 4G:
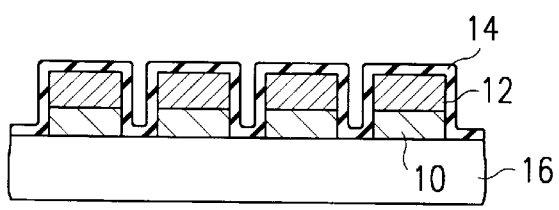

Prior to performing the second anneal step, a cap layer 14 can be deposited over the titanium silicide regions 12. This optional step is illustrated in FIG. 4g. This step can be performed by depositing either an oxide such as silicon dioxide ($SiO_2$) or a nitride such as silicon nitride ($Si_3N_4$) by either low pressure chemical vapor deposition (LPCVD) or plasma enhanced chemical vapor deposition (PECVD).

The tensile stress of the cap layer 14 can be adjusted to adjust the stress of the C49 phase $TiSi_2$ as compressive. The stress of an oxide (or nitride) layer 14 can be varied by varying process conditions during the deposition process. For example, process pressure, RF power and temperature affect the stress of an oxide film formed by PECVD. The above mentioned co-pending applications Ser. Nos. 60/024,235 and 60/026,930 provide details on the formation of a cap layer.

Referring now to FIGS. 5a–5f, a second embodiment process flow is illustrated. As will be clear, the second process flow is very similar to the first process flow embodiment except now the step of patterning the interconnect is performed after formation of the final silicide region. Processing details described with respect to the first embodiment also apply to this embodiment, and vice-versa.

Figure 5A:
FIGS. 5a–5f illustrate various steps during an alternate embodiment process flow.
Figure 5B:
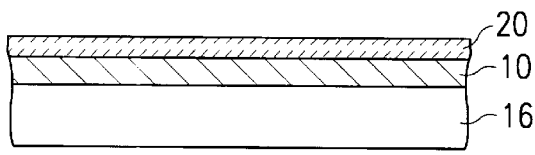
Figure 5C:
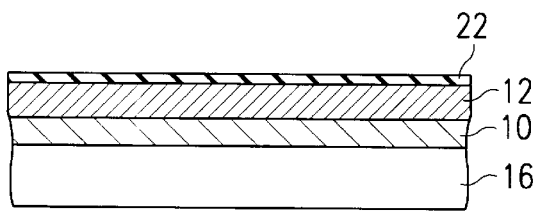
Figure 5D:
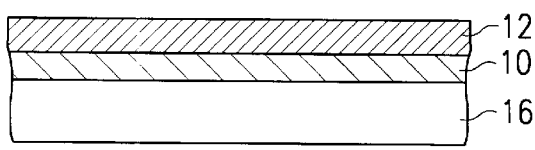

Referring now to FIGS. 5a and 5b, silicon layer 10 and titanium layer 20 are formed over region 16 as described previously. The first anneal step can then be performed to form titanium silicide layer 12 and titanium nitride layer 22 (FIG. 5c). After the titanium nitride layer 22 is removed in FIG. 5d, the second anneal step can be performed. As discussed above, the device is heated while being warped by the chuck.

Figure 5E:
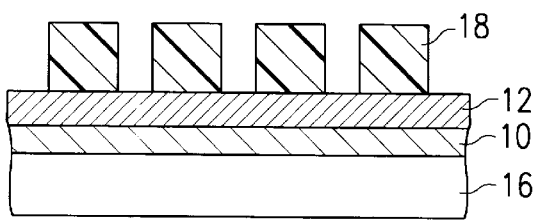
Figure 5F:
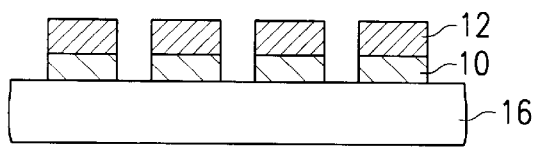

In FIG. 5e, resist layer 18 is formed over the device and patterned. The interconnect regions can then be formed as desired. This final structure is illustrated in FIG. 5f.

Figure 6A:
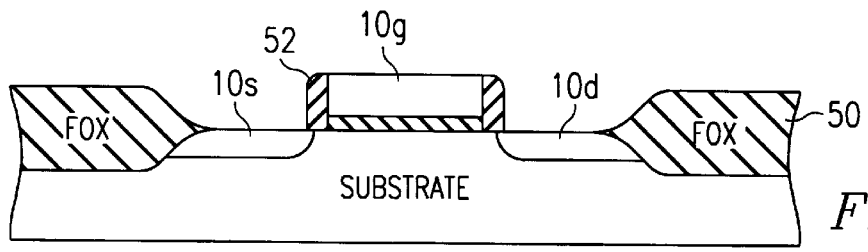
FIGS. 6a–6e illustrate various steps during a second alternate embodiment process flow.

Yet another exemplary embodiment is illustrated in FIGS. 6a–6d. This embodiment utilizes a self-aligned silicide (salicide) process. In this context, a self-aligned process is one in which no masking step is needed to form a silicide in the desired locations. In these figures, a field effect transistor is shown as an arbitrary example of a device which can be silicided. Referring first to FIG. 6a, three silicon layers 10s, 10g and 10d (i.e., the source, gate and drain of the transistor) will be silicided.

Figure 6B:
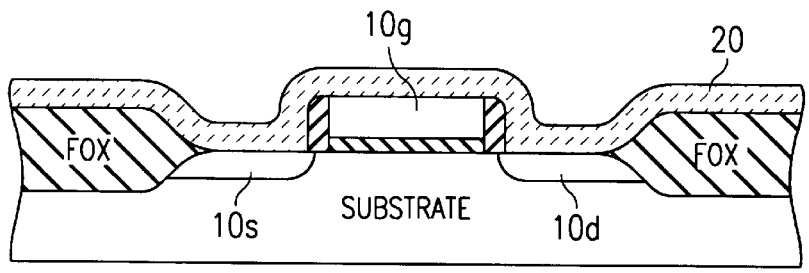

Referring next to FIG. 6b, titanium layer 20 is deposited over the entire transistor device. Any deposition method can be used or other metals can be used, as described elsewhere.

Figure 6C:
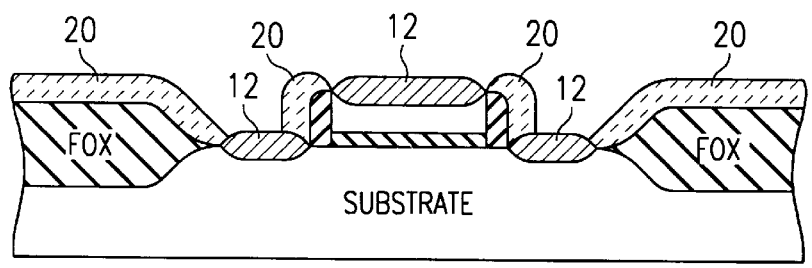

The first anneal step is then performed with the resultant structure illustrated in FIG. 6c. As shown, the titanium 20 reacted with any of the silicon layers 10 to which it was exposed. However, the titanium 20 did not react with insulating regions 50 (field oxide) and 52 (sidewall insulator—e.g., sidewall oxide or nitride). As before, this first anneal step will create C49 phase $TiSi_2$.

Figure 6D:
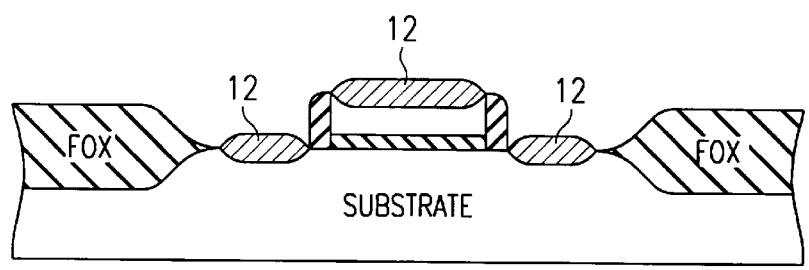

Referring now to FIG. 6d, the extraneous titanium (or titanium nitride or other unwanted by-products) can be removed. After this removal, the device is once again heated to convert the C49 phase $TiSi_2$ to C54 phase $TiSi_2$. As discussed above, an external stress can be applied to facilitate this transition. In the preferred embodiment, the device is located on a warped susceptor during the second annealing step.

Figure 6E:
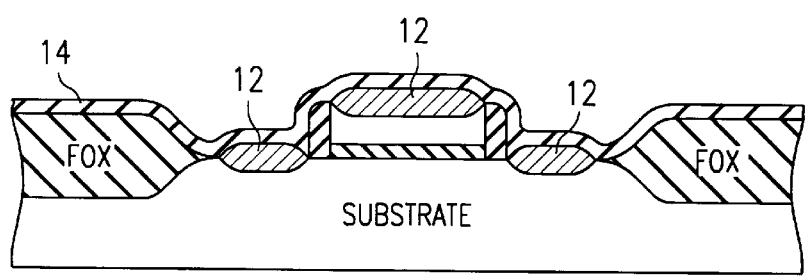

FIG. 6e illustrates an additional step which may be performed prior to the second annealing step. In this embodiment, a cap layer 14 is deposited over titanium silicide regions 12. As described above and in the above-mentioned co-pending application, the tensile stress of cap layer 14 can be adjusted to adjust stress of the C49 phase $TiSi_2$. This additional stress will further facilitate formation of the stable C54 phase $TiSi_2$.

While described herein with respect to a specific process flow, other modifications are envisioned. For example, the cap layer, if used, can be either in an oxide or nitride layer. Experimentation has shown that both $SiO_2$ and $Si_3N_4$ layers formed by dual frequency CVD as the cap layer may be superior but layers formed from other processes can also be used. Experimentation has also shown that a plasma $SiO_2$ layer as a cap layer may be superior to plasma $Si_3N_4$ layers.

The first and/or second heating steps can be performed in a furnace. For example the device can be heated at the appropriate temperature for a period between about 30 and 90 minutes. Alternatively, rapid thermal processing (RTP) can also be utilized.

The method of the present invention can be applied to a variety of ULSI (or other) circuits. This process can be used to form a contact on the source, drain or gate of a MOS transistor device or a contact on other devices such as bipolar transistors, diodes, capacitors, resistors, and other elements. The present invention could also be used for interconnects between various elements within an integrated circuit. Specifically, the present invention would be especially useful for the word lines and bit lines of a dynamic random access memory. The process is especially well-suited for small lithographs such as 0.25 micron line widths.

By using the present invention, low resistivity titanium silicide (e.g., C54 phase) can be formed on the word lines and bit lines of a DRAM (dynamic random access memory). By doing so, access speed can be improved. Speeding up the access speed can maximize the refresh capacity and reduce the area of peripheral circuitry. As a result, chip size can be reduced. Furthermore, the number of interconnect layers can be decreased by the application of this invention to the word lines and bit lines. Since metal interconnects over polysilicon word/bit lines are often used for strapping the word/bit line, a low resistance material like $TiSi_2$ can eliminate the number of metal interconnects. This invention therefore offers cost reduction to DRAM manufacturing.

The multi-phase phenomenon seen in titanium is also observed in other materials. As an example, a tungsten silicide ($WSi_2$) film exhibits hexagonal or tetragonal crystal structures based upon annealing temperature. In the case of $WSi_2$, the anneal temperature will be around 900° C. to obtain low resistivity. But the transition from hexagonal to tetragonal is not the same as the C49-to-C54 transition of $TiSi_2$ and therefore there is not as much difficulty in phase transition.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a titanium silicide region on a semiconductor device, said method comprising the steps of:
    providing a silicon layer;
    forming a titanium layer over the silicon layer;
    heating the silicon layer and the titanium layer to a first temperature so that the silicon layer and titanium react to form a titanium silicide region of a first type; and
    applying an external force to said titanium silicide region of a first type sufficient to overcome an opposite force to be developed by conversion of said titanium silicide region of a first type to a titanium silicide region of a second type and simultaneously heating the titanium silicide region of a first type to a higher temperature to convert said titanium silicide of a first type to said titanium silicide of a second type while said conversion provides said opposite force, force wherein said external force is applied to said titanium silicide by warping the semiconductor device on a susceptor with a radius of curvature.

2. The method of claim 1 wherein said step of providing a silicon layer comprises the step of depositing a polycrystalline silicon layer.

3. The method of claim 1 wherein said step of forming a titanium layer comprises sputtering a titanium layer.

4. The method of claim 1 and further comprising the step of depositing an insulating layer over the titanium layer.

5. The method of claim 4 wherein the depositing step is performed after heating the silicon and titanium to a first temperature.

6. The method of claim 4 wherein the depositing step is performed prior to heating the silicon and titanium layers to a first temperature.

7. The method of claim 1 wherein the first temperature is between about 450° C. and 600° C. and the second temperature is between about 650° C. and 750° C.

8. The method of claim 1 and further comprising the step of patterning said titanium and silicon layers.

9. The method of claim 8 wherein said patterning step is done before the formation of the titanium suicide layer.

10. The method of claim 8 wherein said patterning step is done after the formation of the titanium silicide layer.

11. The method of claim 1 wherein the radius of curvature is less than 350 m.

12. The method of claim 11 wherein the radius of curvature is between about 200 and 250 m.

13. The method of claim 11 wherein the radius of curvature is between about 75 m and 125 m.

14. The method of claim 11 wherein the radius of curvature is between about 275 m and 325 m.

15. The method of claim 1 wherein the titanium silicide region is formed using a self-aligned process.

16. A method of forming a titanium silicide layer, said method comprising the steps of:

providing a silicon layer;

forming a titanium layer over the silicon layer;

heating the titanium layer and the silicon layer to form a titanium silicide layer of the C49 phase;

locating the titanium silicide layer of C49 phase on a susceptor, the susceptor being warped to a radius of curvature to provide a compressive force to said titanium silicide layer of C49 phase; and heating said C49 titanium silicide layer while located on the warped susceptor to form a C54 titanium silicide layer, said susceptor counteracting forces developed in said C49 titanium silicide as a result of said formation of C54 titanium silicide due to said heating.

17. The method of claim 16 wherein the radius of curvature is less than 350 m.

18. The method of claim 16 wherein the step of heating the titanium layer and the silicon layer is performed at a lower temperature than the step of heating the titanium silicide layer.

19. The method of claim 18 wherein the first temperature is between about 550° C. and 600° C. and the second temperature is between about 700° C. and 750° C.

20. The method of claim 16 further comprising the step of depositing a cap layer over said titanium silicide so that said cap layer applies a stress during the step of heating the titanium silicide layer.

21. A method of forming a silicide layer, said method comprising the steps of:

providing a silicon layer;

forming a refractory metal layer over the silicon layer;

heating the refractory metal layer and the silicon layer to form a refractory metal silicide layer of a first type;

locating the refractory metal silicide on a susceptor, the susceptor being warped to a radius of curvature sufficient to apply an external stress to said refractory metal silicide layer of a first type to overcome an opposite force and counteracting force to be developed by conversion of said silicide layer of a first type to a silicide layer of a second type; and heating the silicide layer while applying said stress to convert said refractory metal silicide layer to said second type to lower the resistivity of the refractory metal silicide layer.

22. The method of claim 21 wherein the refractory metal layer comprises a titanium layer.

23. The method of claim 21 wherein the refractory metal layer comprises a tungsten layer.

* * * * *